(12) United States Patent
Xia et al.

(10) Patent No.: US 6,583,011 B1
(45) Date of Patent: Jun. 24, 2003

(54) METHOD FOR FORMING DAMASCENE DUAL GATE FOR IMPROVED OXIDE UNIFORMITY AND CONTROL

(75) Inventors: Li Xia, Singapore (SG); Gao Feng, Singapore (SG); Yong Meng Lee, Singapore (SG)

(73) Assignee: Chartered Semiconductor Manufacturing Ltd.

( * ) Notice: Subject to any disclaimer, the term of this patent is extended or adjusted under 35 U.S.C. 154(b) by 0 days.

(21) Appl. No.: 09/480,267

(22) Filed: Jan. 11, 2000

(51) Int. Cl.$^7$ .......................................... H01L 21/8234
(52) U.S. Cl. ........................................ 438/275; 438/981
(58) Field of Search ................................ 438/241, 258, 438/275, 283, 296, 981

(56) References Cited

U.S. PATENT DOCUMENTS

| | | | | |
|---|---|---|---|---|
| 4,651,406 A | * | 3/1987 | Shimizu et al. | 438/258 |
| 5,330,920 A | | 7/1994 | Soleimani et al. | 437/24 |
| 5,668,035 A | | 9/1997 | Fang et al. | 438/239 |
| 5,863,819 A | | 1/1999 | Gonzalez | 438/238 |
| 5,882,993 A | | 3/1999 | Gardner et al. | 438/591 |
| 5,918,133 A | | 6/1999 | Gardner et al. | 438/299 |
| 5,926,729 A | | 7/1999 | Tsai et al. | 438/591 |
| 6,066,533 A | * | 5/2000 | Yu | 438/275 |
| 6,140,185 A | * | 10/2000 | Kimura | 438/275 |

* cited by examiner

Primary Examiner—Chandra Chaudhari
(74) Attorney, Agent, or Firm—George O. Saile; Rosemary L. S. Pike

(57) ABSTRACT

A method to grow layers of gate oxide or gate base materials of different thicknesses for dual gate structures. The process starts with a semiconductor surface in which STI regions have been formed and over the surface of which a layer of gate base material has been grown. A dielectric, such as nitride, is deposited, masked and etched over a first region where thin gate base material must be created thereby exposing the surface of the deposited layer of gate base material in that region. The gate base material is etched to the desired thickness, creating a first thin layer of gate base material. A thick first layer of gate electrode material, poly, is deposited over the dielectric thereby including the surface of the first thin layer of gate base material, and polished down to the surface of the dielectric leaving gate electrode material deposited in the opening above the first thin layer of gate base material. The process creates over a second region of the gate base material a gate electrode having a second thickness of the gate base material. The dielectric is removed leaving gate electrode structures in place above thin layers of gate base materials, the latter being of different thicknesses.

33 Claims, 4 Drawing Sheets

METHOD FOR FORMING DAMASCENE DUAL GATE FOR IMPROVED OXIDE UNIFORMITY AND CONTROL

BACKGROUND OF THE INVENTION (1) Field of the Invention

The invention relates to the fabrication of integrated circuit devices, and more particularly, to a simplified method of growing oxide layers of different thicknesses.

(2) Description of the Prior Art

Developments in the semiconductor industry have over the years focused on a wide array of technical disciplines, device designs and device packaging approaches. Improved semiconductor performance can be obtained following one or more of these avenues. Where a large number of semiconductor improvements have been obtained by device miniaturization, other approaches have sought to improve device performance by creating multifunction devices on one semiconductor die. Historically, semiconductor devices have been broadly divided in functions of data manipulation (logic devices) or data storage (memory devices). Devices that address these two different data processing functions have also historically been stored on different physical devices. Where however memory cells are created on a device that mostly functions as a data storage and data retrieval device, the actual memory cells within the device are typically surrounded by peripheral functions such as address decoders, read/write buffers and sense amplifiers.

The creation of many semiconductor devices starts with the growing of a layer of gate oxide over the surface where the device is to be located. The gate oxide is a thin thermal oxide, which allows better adhesion between the overlying layers (for instance nitride) and the (underlying) silicon and acts as a stress relaxation layer during field oxidation. Gate oxide can be formed by thermal oxidation of the underlying silicon and can also be formed in conjunction with a deposited oxide layer, nitride layer or any other material suitable for use as a gate dielectric. Gate oxide is usually formed as a silicon dioxide material but may be a composite oxide, such as TEOS and silicon dioxide, or a nitride oxide layer or a like gate dielectric. A gate oxide layer can for instance be grown in an oxidation steam ambient at a temperature between about 850 and 1000 degrees C. to a thickness between about 50 and 250 Angstrom.

Device performance is highly dependent on the thickness of the layer of gate oxide. In devices that combine Field Effect Transistor (FET) devices with surrounding logic devices, the combined function that is provided by one semiconductor device requires the deposition of gate oxide layers of different thickness. Typically, surrounding logic functions required the use of a thin layer of gate oxide to enhance overall device performance while a thicker gate oxide is required in view of the required higher gate voltage for the FET access transistor of DRAM cells. As an example, with a voltage bias of about 2 volts of the substrate on which a FET memory device is created, a voltage difference of about 5 volts is required between the gate electrode and the substrate resulting in a gate voltage of 7 volts for the FET access transistor of the memory cells. The FET's of the logic portion of the circuit however require a gate voltage of about 3.3 volts, making it clear that layers of pad oxide are required for these devices that are of different thickness.

Another application where gate oxide layers of different thickness is required is in the application of MOS devices where combined PMOS and NMOS devices are created that form a converter. The majority carriers of PMOS devices are holes; the majority carriers of NMOS devices are electrons. Holes have a considerable lower mobility than electrons resulting in a lower drive capability of the PMOS device. To compensate for this and to equalize the drive capability of the two types of devices, either the gate of the PMOS device is widened (allowing more drive current for a given gate voltage) or the thickness of the gate oxide layers for the two types of devices is adjusted allowing for higher gate current while maintaining gate width the same. Of these two solutions, the varying of the thickness of the gate oxide is the more promising since the widening of the gate electrode requires surface area, which is contrary to the desire of miniaturization of the devices. One of the techniques (provided by U.S. Pat. No. 5,330,920) that can be used to create gate oxide layers of different thickness is by selective ion implanting of a sacrificial layer of oxide that has been created over the surface of the substrate. The layer of gate oxide that is created over the surface that has been ion implanted is thinner than the gate oxide that is created over the surface that has not been subjected to ion implantation.

It is clear that the combination of providing different functions within the design of one semiconductor device brings with it the requirement for different thickness of the gate oxide layer. Typically, high voltage devices such as program and erase transistors require a relative thick layer of gate oxide that protects the device against high voltage breakdown. Where however device speed is important, a thin layer of oxide is required, operating speed is enhanced with a thin layer of oxide combined with a narrow gate structure (short channel length). These latter requirements gain further importance where devices with micron or sub-micron device features are implemented.

Layers of tunnel oxide are created under the floating gates of flash memory EEPROM devices. Data retention requirements of the EEPROM devices require that these layers of tunnel oxide have at least a minimum thickness, a requirement that may conflict with requirements of other oxide layer thickness of devices that are also contained within the EEPROM device. For non-volatile memory devices, this leads to the need for layers of oxide that have three different thicknesses. The data entry and erase transistors typically require (high date retention which means) relatively thick layers of pad oxide, the surrounding logic functions require (high operating speed which means) relatively thin layers of oxide and a thickness for the layer of tunnel oxide that is determined by requirements of device reliability.

Prior Art methods of forming oxide layers of different thickness use multiple steps of masking and oxide etch. The first layer created in this manner, typically the thickest layer, is initially grown on the surface of the substrate. This layer is masked with a layer of photoresist and etched thereby removing the unmasked layer of oxide from the substrate. The mask of photoresist is removed; a second layer of oxide is then grown over the surface of the substrate including the remaining first layer of oxide. This process results in a layer of oxide that has two thickness levels. This process can be repeated for the application where more than two levels of thickness are required, using a sequence of steps of deposition and etch. This process however suffers from the disadvantage of many sequential processing steps while the repeated use of photoresist, which is not easy to completely remove, results in layers of oxide of poor quality. Partial etch back of a deposited layer of oxide can also be used but this method too suffers from the same disadvantages.

The invention addresses the growing of layers of oxide that have, for each layer of oxide, a uniform thickness but where the different oxide layers have different thicknesses. The method of the invention is aimed at growing gate oxide layers for dual gate devices. Current processes for growing dual-gate devices start with an initial thicker layer of oxide, which is stripped back in the region where a thin layer of oxide is required. The oxide can be selectively stripped back only in the region where the thin layer of oxide is required, resulting in two layers of oxide with different thicknesses. For some applications, the oxide is blanket stripped back, which requires that the oxide where a thick layer is required must be regrown. The balancing of oxide strip back and regrowth is an extremely delicate operation that requires very good control in oxide growth rate and oxide strip back rates. To maintain good oxide quality and good oxide uniformity remains a challenge.

U.S. Pat. No. 5,918,133 (Gardner) shows a dual gate oxide thickness within one opening. Gardner shows steps (1), (2) and (3).

U.S. Pat. No. 5,882,993 (Gardner et al.) shows a dual oxide thickness process.

U.S. Pat. No. 5,668,035 (Fang et al.) U.S. Pat. No. 5,926,729 (Tsai et al.) and U.S. Pat. No. 5,863,819 (Gonzalez) show dual gate oxide processes.

SUMMARY OF THE INVENTION

A principle objective of the invention is to provide a method for oxide growth that gives good control over the oxide growth process.

Another objective of the invention is to provide a method for oxide growth that provides a uniform layer of oxide.

Yet another objective of the invention is to provide a method of oxide growth that eliminates delicate conventional processing steps of oxide growth rates and oxide etch back.

A still further objective of the invention is to provide a method that allows for the independent growing of multi-thickness layers of oxide.

In accordance with the objectives of the invention a new method is provided to grow layers of gate oxide of different thicknesses for dual gate structures. The process of the invention starts with a semiconductor surface in which Shallow Trench Isolation regions have been formed and over the surface of which a layer of gate oxide has been deposited. A layer of nitride is deposited over the layer of gate oxide. The layer of nitride is masked and etched over a first region where thin oxide must be created thereby exposing the surface of the deposited layer of oxide in that region. The layer of oxide is removed after which a first thin layer of gate oxide will be grown. A thick first layer of poly is deposited over the layer of nitride thereby including the surface of the first thin layer of gate oxide. The thick layer of poly is polished down to the surface of the layer of nitride leaving poly deposited in the opening above the first thin layer of gate oxide. The process that has been used to create a poly gate having a first thickness of the layer of gate oxide is repeated but this time over a second region of the gate oxide thereby creating a poly gate having a second thickness of the layer of gate oxide. The layer of nitride is removed leaving poly gate structures in place above thin layers of gate oxide, the latter being of different thicknesses.

DESCRIPTION OF THE PREFERRED EMBODIMENTS

Figure 1:
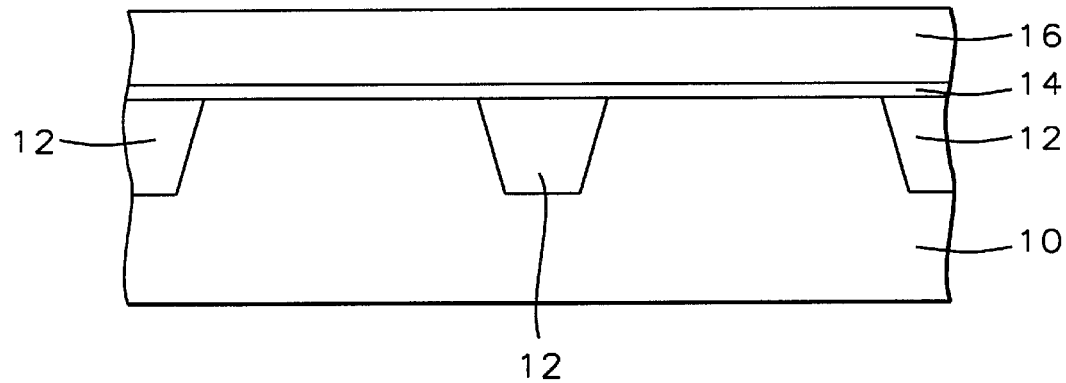
FIG. 1 shows a cross section of a semiconductor substrate wherein Shallow Trench Isolation regions have been formed, a layer of sacrificial oxide has been grown over the surface of the substrate and channel, well and punchthrough implants have been performed. A layer of nitride has been deposited over the surface of the layer of sacrificial oxide.

Referring now specifically to FIG. 1, there is shown a cross section of a semiconductor substrate 10 wherein Shallow Trench Isolation regions 12 have been formed, a layer 14 of sacrificial oxide has been grown over the surface of the substrate 10 and channel, well and punchthrough implants (not shown) have been performed. A layer 16 of nitride has been deposited over the surface of the layer of sacrificial oxide.

Substrate 10 is typically of single crystalline silicon with <100>crystal orientation.

STI's regions 12 can be made using a variety of methods. For instance, one method is the application of Buried Oxide (BOX) isolation, which can be used for shallow trenches. The method involves filling the trenches with a chemical vapor deposition (CVD) of silicon oxide ($SiO_2$), the silicon oxide is then etched back or mechanically or chemically polished to yield a planar surface. The shallow trenches etched for the BOX process are anisotropically plasma etched into the silicon substrate and are typically between 0.3 and 0.8 micrometer ($\mu$m) deep. STI regions are formed around the active device to a depth between about 4,000 and 20,000 Angstrom.

Another approach in forming STI's is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metallization. The silicon nitride is provided to the silicon to prevent polishing of the masked silicon oxide of the device.

The layer 14 of sacrificial oxide is deposited on the bare silicon after the silicon surface has been cleaned. The layer consists of a between about 100 and 200 Angstrom thick layer of $SiO_2$ and can be thermally grown on the surface of the wafer. The purpose of this layer is to cushion the transition of the stress between the silicon substrate and the subsequently deposited layer of nitride. In general, the thicker the layer 14 of pad oxide, the less edge force is being transmitted from the nitride 16 to the silicon substrate 10. On the other hand, a thick layer of pad-oxide will render the nitride layer ineffective as an oxidation mask by allowing lateral oxidation to take place. Therefore, the minimum pad-oxide that will avoid the formation of dislocations should be used. As a rule of thumb, the minimum thickness of a thermally grown oxide layer 14 should be at least one-tenth the thickness of the nitride layer 16. Typically, a blanket pad oxide can be formed to a thickness of about 200 Angstrom through a thermal oxidation method at a temperature of about 900 degrees C. for a time period of about 10 to 20 minutes.

The layer 16 of silicon nitride ($Si_3Ni_4$) can be deposited using LPCVD or PECVD procedures at a pressure between about 300 mTorr and 400 mTorr, at a temperature between about 600 and 800 degrees C., to a thickness 3000 Angstrom using $NH_3$ and $SiH_4$. The silicon nitride layer 16 can also be deposited using LPCVD or PECVD procedures using a reactant gas mixture such as dichlorosilane ($SiCl_2H_2$) and amonia ($NH_3$).

A conventional channel implant (not shown in FIG. 1) has also been performed into the surface of the substrate 10 that is shown in cross section in FIG. 1. Conditions for channel implants vary widely and are determined by the particular application for which a device is being created. As examples, a channel implant can be a P-well implant using boron with an energy within the range of between 100 to 220 KeV and a dose within the range of between 1e13 to 1e14 atoms/$cm^2$, it can be a P-well implant using boron with an energy within the range of between 5 to 40 KeV and a dose within the range of between 1e12 to 5e13 atoms/$cm^2$, it can be a P-well implant using indium with an energy within the range of between 50 to 250 KeV and a dose within the range of between 1e12 to 1e14 atoms/$cm^2$, it can be an N-well implant using phosphorus with an energy within the range of between 300 to 600 KeV and a dose within the range of between 1e13 to 5e14 atoms/$cm^2$, it can be an N-well implant using phosphorus with an energy within the range of between 50 to 300 KeV and a dose within the range of between 1e12 to 5e13 atoms/$cm^2$, etc.

Figure 2:
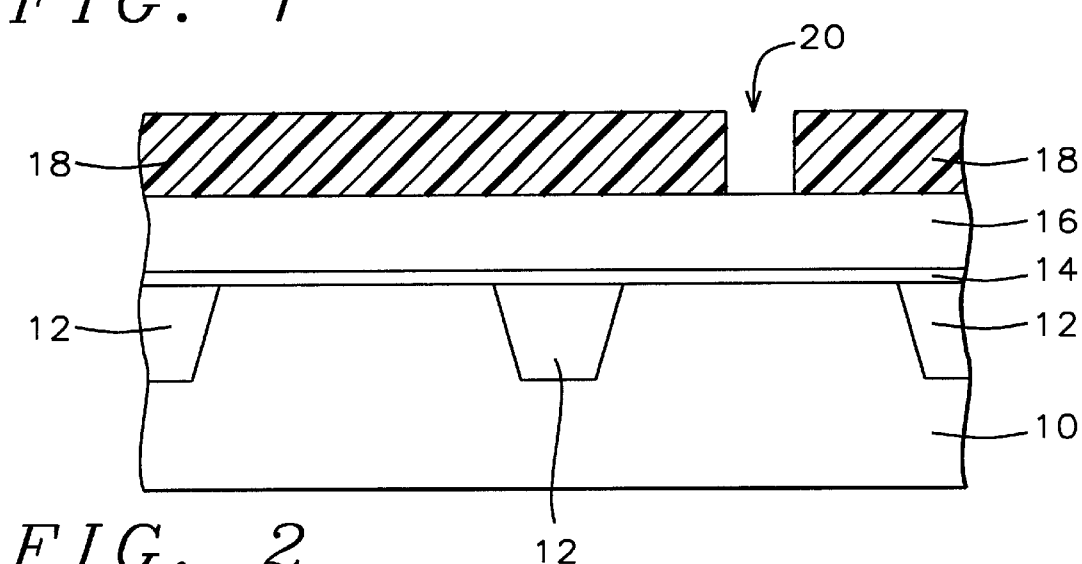
FIG. 2 shows a cross section after the layer of nitride has been patterned using the reverse gate pattern for the gate where a thin layer of oxide must be created.

FIG. 2 shows a cross section after the layer 16 of nitride has been patterned using the reverse gate pattern for the gate where a thin layer of oxide must be created. Layer 18 is a first layer of photoresist and is patterned as shown such that the opening 20 that is created in the layer 18 of photoresist aligns with the region of the sacrificial layer 14 of oxide where the first thin layer of oxide is to be created.

The deposition and patterning of the layer 18 of photoresist uses conventional methods of deposition and photolithography that are well known in the art. Photoresist stripping frequently uses sulfuric acid ($H_2SO_4$) and mixtures of $H_2SO_4$ with other oxidizing agents such as hydrogen peroxide ($H_2O_2$), the same components are frequently used in cleaning a wafer surface after the photoresist has been stripped.

Figure 3:
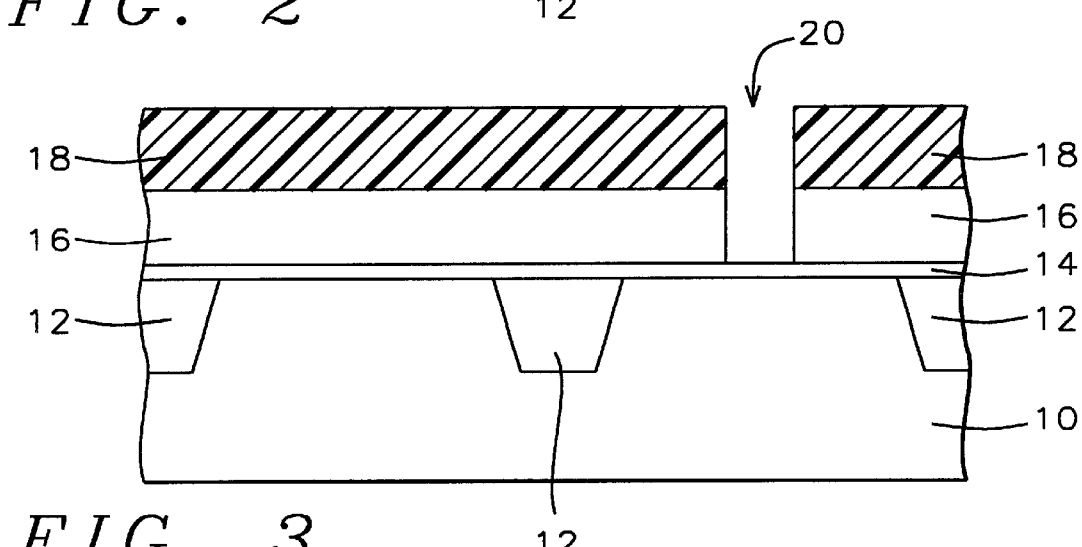
FIG. 3 shows a cross section after the layer of nitride has been etched in accordance with the pattern of FIG. 2.

FIG. 3 shows a cross section after the layer 16 of nitride has been etched in accordance with the mask that is provided by the patterned layer 18 of photoresist.

The silicon nitride layer 16 can be wet etched using a buffered oxide etchant (BOE). The BOE may comprise a mixed solution of fluoroammonium and fluorohydrogen (7:1) and phosphoric acid solution. The silicon nitride can also be etched using anisotropic RIE using $CHF_3$ or $SF_6$—$O_2$ as an etchant. The silicon nitride layer 14 can also be dipped into phosphoric acid ($H_3PO_4$) to be removed.

The preferred method of the invention to etch the nitride layer 16 removes the layer 16 of nitride down to the surface of the underlying layer 14 of sacrificial oxide, the etch is an anisotropic RIE using $CHF_3$ or $SF_4$ as an etchant, the duration of the etch is about 150 seconds.

Figure 4:
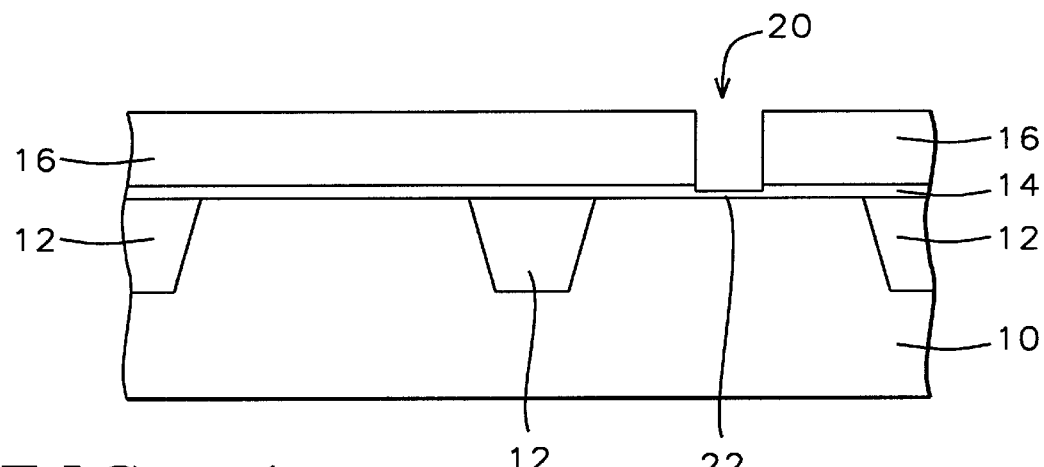
FIG. 4 shows a cross-section where the photoresist mask have been removed, the exposed pad oxide has been removed and the first thin layer of oxide has been created.

FIG. 4 shows a cross section where the photoresist mask 18 has been removed, the exposed pad oxide has been removed by HF and the first thin layer 22 of gate oxide has been created. The layer 18 of photoresist is removed using the conventional process of asking followed by clean. A thin layer 22 of gate oxide is created at the bottom of opening 20 by rapid thermal oxidation at a temperature between about 800 and 1000 degrees C. for a time between about 10 and 20 seconds thereby forming a thin layer of nitrogen gate oxide with a thickness between about 10 and 30 Angstrom. It is clear that a thick layer of oxide can also be formed in this manner at the bottom of opening 20. By applying rapid thermal oxidation at a temperature between about 800 and 1000 degrees C. for a time between about 20 and 40 seconds, a relatively thick layer 22 of gate oxide is formed at the bottom of opening 20 with a thickness between about 40 and 70 Angstrom. For continuity of discussion, it is assumed that the layer 22 as shown in FIG. 4 is a thin layer of gate oxide that has been created following the processing conditions that have been indicated above for the creation of a thin layer of oxide.

Figure 5:
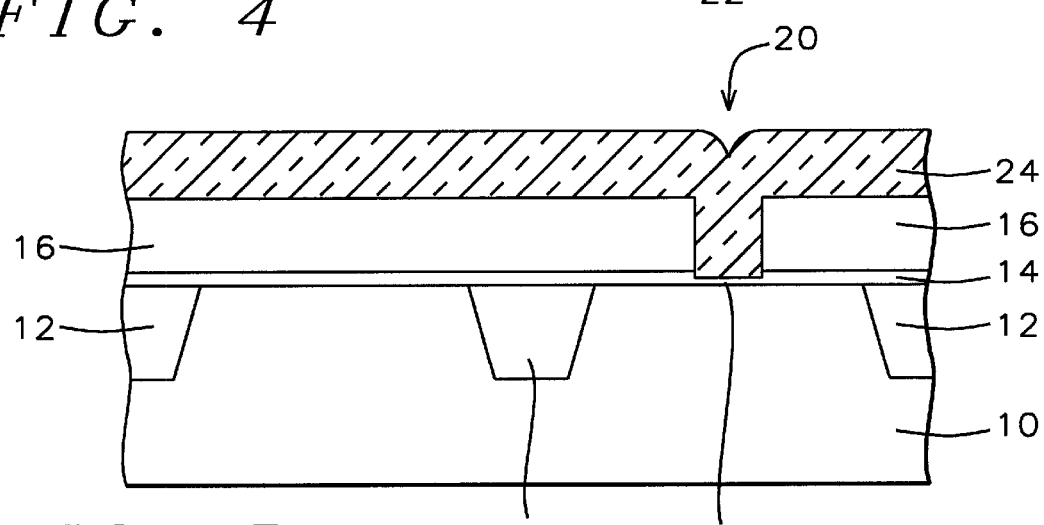
FIG. 5 shows a cross section after a first layer of polysilicon has been blanket deposited over the layer of nitride including the opening that has previously been etched in the layer of nitride.

FIG. 5 shows a cross section after a first layer 24 of polysilicon has been blanket deposited over the layer 16 of nitride including the opening 20 that has previously been etched in the layer of nitride. Layer 24 of polysilicon can be grown at a temperature between 600 and 640 degrees C. using LPCVD to a thickness of between about 3000 and 4000 Angstrom.

Figure 6:
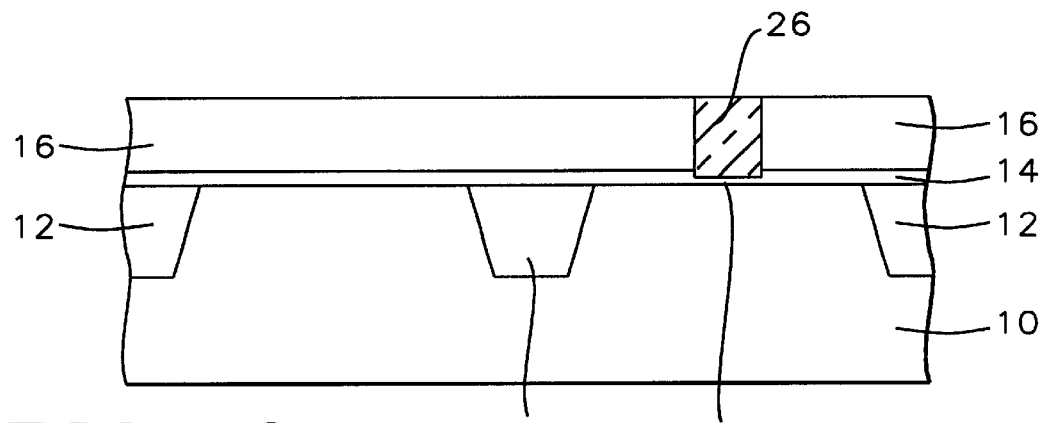
FIG. 6 shows a cross section after the layer of poly has been polished thereby leaving a gate electrode of poly in place over the thin layer of oxide.

FIG. 6 shows a cross section after the layer 24 of poly has been polished thereby leaving a gate electrode 26 of poly in place over the thin layer 22 of oxide. The layer 24 of poly is removed using CMP and is removed to the surface of the layer 16 of nitride.

Figure 7:
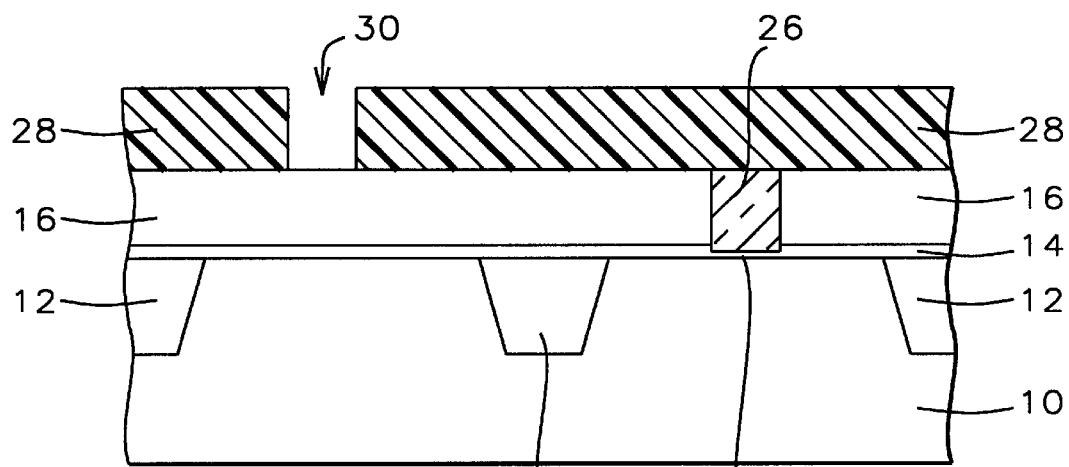
FIG. 7 shows a cross section after a second layer of photoresist has been deposited and patterned forming an opening over the region where a thick layer of oxide needs to be grown.

FIG. 7 shows a cross section after a second layer 28 of photoresist has been deposited and patterned forming an opening 30 in the layer 28 of photoresist that aligns with the region of the sacrificial oxide where a thick layer of oxide needs to be created. The deposition and patterning of the second layer 28 of photoresist uses conventional methods of deposition and photolithography that are well known in the art, processing conditions and methods that can be used to etch the layer 28 of photoresist have already been indicated under FIG. 2 above.

Figure 8:
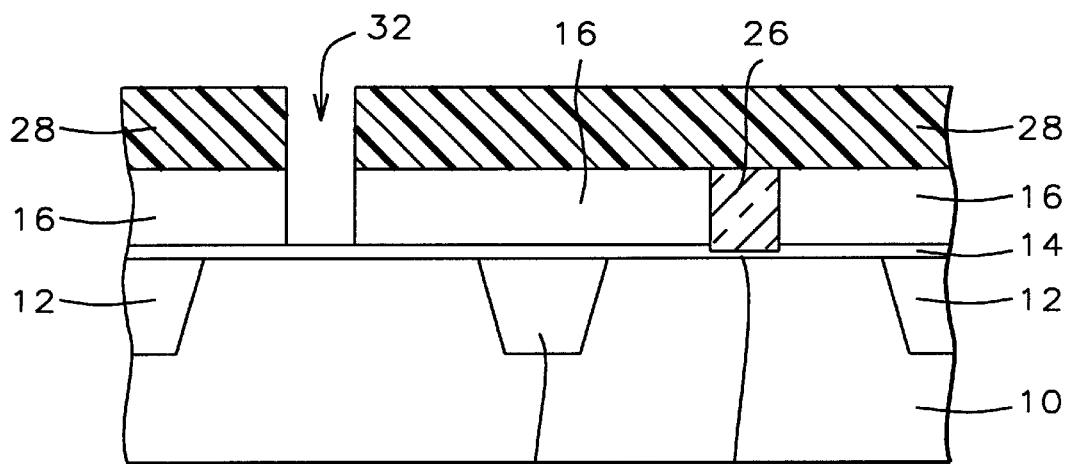
FIG. 8 shows a cross section after the layer of nitride has been etched in accordance with the pattern of FIG. 7.

FIG. 8 shows a cross section after the layer 16 of nitride has been etched in accordance with the photoresist mask pattern 30 of FIG. 7. The etch of layer 16 of nitride has created an opening 32 that penetrates the layer 16 of nitride down to the surface of the layer 14 of sacrificial oxide. This opening 32 exposes the surface of the sacrificial oxide so that this surface can be subjected to subsequent processing steps.

Figure 9:
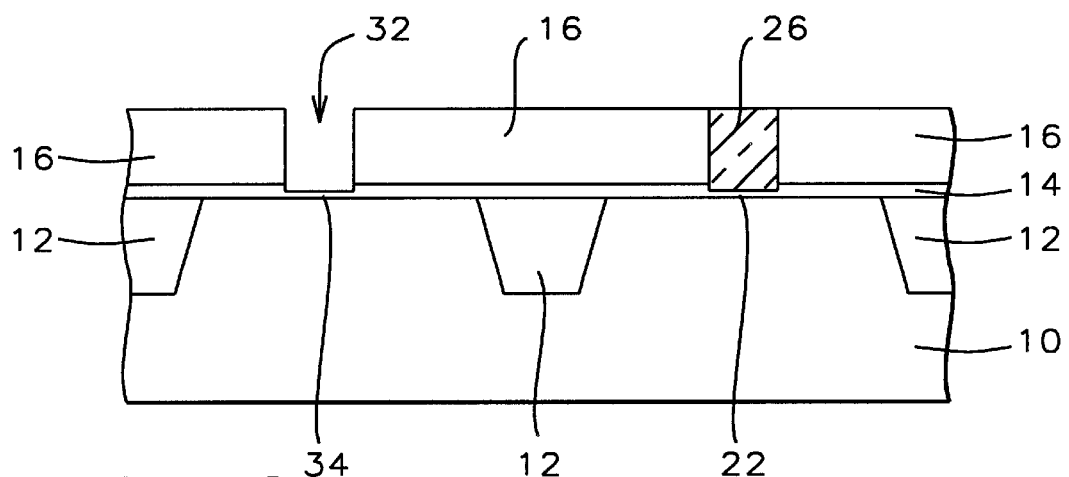
FIG. 9 shows a cross section after the photoresist mask has been removed, the exposed pad oxide has been removed and the second thin layer of oxide has been formed.

FIG. 9 shows a cross section after the photoresist mask 28 has been removed and a thick layer of gate oxide has been formed. It must be remembered that it was suggested under the above description of FIG. 2 that layer 22 of FIG. 4 was created as a thin layer of gate oxide. The process of the invention is aimed at creating two layers of oxide that are of different thicknesses. Since layer 22 of FIG. 4 was created as being a thin layer of oxide, layer 34 of FIG. 9 is to be created as a thick layer of oxide. Therefore, by applying rapid thermal oxidation at a temperature between about 800 and 1000 degrees C. for a time between about 20 and 40 seconds, a relatively thick layer 34 of gate oxide is formed at the bottom of opening 32 with a thickness between about 40 and 70 Angstrom.

It is clear that the invention allows for the inversion of the thicknesses of the layer of gate oxide. A thin layer of gate oxide can be created at the bottom of either opening 20 of FIG. 4 or at the bottom of opening 32 of FIG. 9. It is only of importance to the objective of the invention that the layers of gate oxide that are created at both openings are of different thicknesses.

Figure 10:
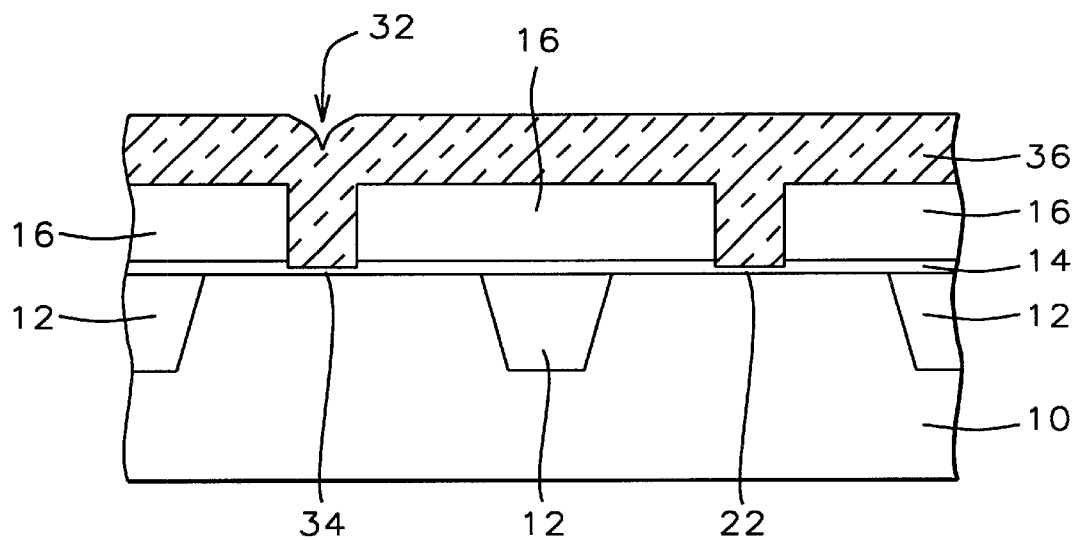
FIG. 10 shows a cross section after a thick second layer of poly has been deposited over the surface of the layer of nitride thereby including the opening that has been etched into the layer of nitride.

FIG. 10 shows a cross section after a thick second layer 36 of poly has been deposited over the surface of the layer 16 of nitride thereby including the opening 32 that has been etched into the layer 16 of nitride.

Figure 11:
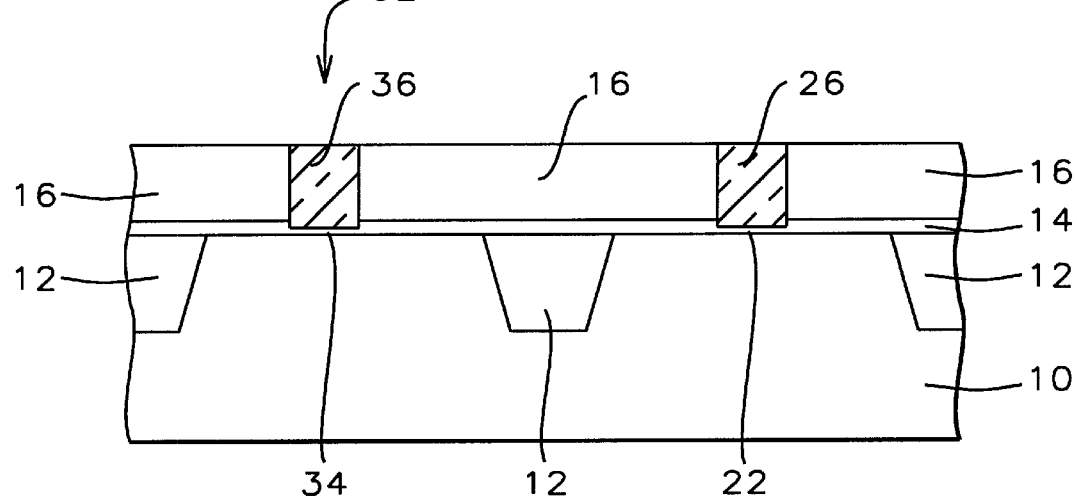
FIG. 11 shows a cross section after the thick layer of poly has been polished.

FIG. 11 shows a cross section after the thick second layer 36 of poly has been polished, leaving opening 32 filled with the poly that now forms the poly for a gate electrode.

It is of value to briefly restate what the process of the invention has created two layers of gate oxide of different thicknesses, that is layers 22 and 34, and that the process of the invention has created these two layers of gate oxide by applying a sequence of well controlled processing steps.

Figure 12:
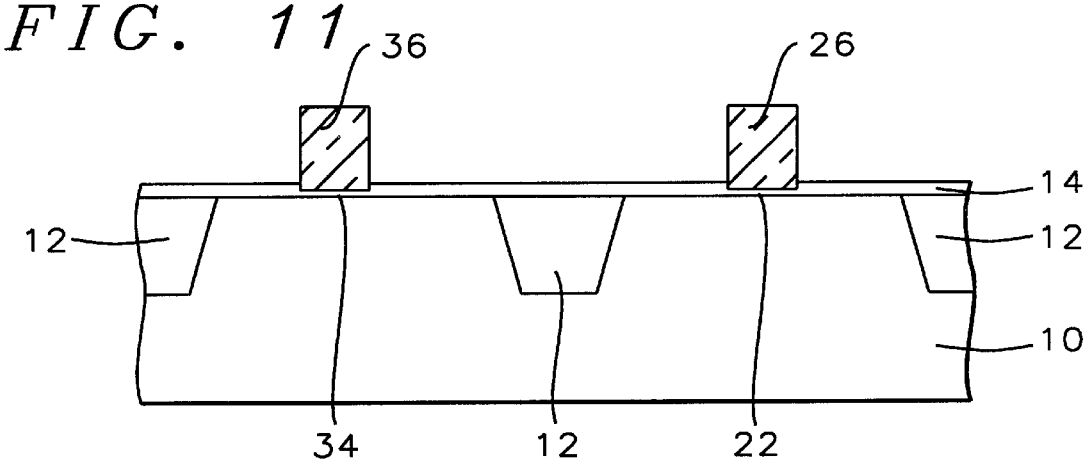
FIG. 12 shows a cross section after the layer of nitride has been removed.

FIG. 12 shows the final processing step of the invention where the nitride layer 16 is removed from the surface of the substrate 10. This leaves gate electrodes 26 and 36 in place, underlying these two gate electrodes are the layers 22 and 34 of different gate oxide thicknesses. The structure that has been created up to this point is now ready for further processing.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating thin layers of gate base material of different thickness for dual gate devices, comprising the steps of:
   (i) providing a semiconductor substrate;
   (ii) providing Shallow Trench Isolation regions in the surface of said substrate;
   (iii) depositing a layer of gate base material on the surface of said substrate;
   (iv) performing channel implant, well implant, and punch-through implant into the surface of said substrate;
   (v) depositing a layer of dielectric over the surface of said layer of gate base material;
   (vi) creating first gate electrodes over the surface of said substrate, said first gate electrodes overlying a layer of gate base material of a first thickness on the surface of said substrate, said creating first gate electrodes comprising the steps of:
       (a) first patterning and etching said layer of dielectric, creating first openings in said layer of dielectric, said first openings to align with the surface of said layer of gate base material where a first thickness layer of gate base material is to be created;
       (b) first etching said layer of gate base material in accordance with said first openings created in said layer of dielectric;
       (c) depositing a first layer of gate electrode material over the surface of said layer of dielectric; and
       (d) removing said first layer of gate electrode material from the surface of said layer of dielectric thereby leaving said first gate electrode material inside said first openings in said layer of dielectric;
   (vii) creating second gate electrodes, said second gate electrodes overlying a layer of gate base material of a second thickness on the surface of said substrate; and
   (viii) removing said layer of dielectric.

2. The method of claim 1 wherein said depositing a layer of gate base material is depositing a layer of pad oxide on the surface of said substrate formed to a thickness of between about 150 and 250 Angstrom through a thermal oxidation method at a temperature of about 900 degrees C. for a time period of about 10 to 20 minutes.

3. The method of claim 1 wherein said depositing a layer of dielectric is depositing silicon nitride ($Si_3Ni_4$) using LPCVD or PECVD procedures at a pressure between about 300 mTorr and 400 mTorr, at a temperature between about 600 and 800 degrees C., to a thickness between about 2500 and 3500 Angstrom using $NH_3$ and $SiH_4$.

4. The method of claim 1 wherein said depositing a layer of dielectric is depositing silicon nitride ($Si_3Ni_4$) using LPCVD or PECVD procedures at a pressure between about 300 mTorr and 400 mTorr, at a temperature between about 600 and 800 degrees C., to a thickness between about 2500 and 3500 Angstrom using a reactant gas mixture such as dichlorosilane ($SiCl_2H_2$) and ammonia ($NH_3$).

5. The method of claim 1 whereby said first patterning and etching said layer of dielectric creates first openings in said layer of dielectric whereby said first openings align with first regions in said layer of gate base material where gate base material layers of a first thickness are to be created, exposing said layer of said gate base material in said regions of first thickness.

6. The method of claim 1 whereby said first etching said layer of gate base material is etching said layer of gate base material in said regions of first thickness to a thickness, creating layers of gate base material of a first thickness.

7. The method of claim 6, said gate base material comprising pad oxide, said first etching said layer of gate base material in said regions of first thickness to a required thickness is a rapid thermal oxidation at a temperature between about 800 and 1000 degrees C. for a time between about 10 and 20 seconds thereby forming a layer of gate base material with a thickness between about 10 and 30 Angstrom.

8. The method of claim 6, said gate base material comprising pad oxide, said etching said layer of gate base material in said regions of first thickness to a thickness is a rapid thermal oxidation at a temperature between about 800 and 1000 degrees C. for a time between about 20 and 40 seconds, forming a layer of gate base material with a thickness between about 40 and 70 Angstrom.

9. The method of claim 1, whereby said depositing a first layer of gate electrode material over the surface of said layer of dielectric is depositing a layer of polysilicon whereby said first layer of gate electrode material is deposited to a thickness of between about 3000 and 4000 Angstrom over the surface of said layers of gate base material of first thickness.

10. The method of claim 1 whereby said removing said first layer of gate electrode material from the surface of said layer of dielectric is leaving said first gate electrode material inside said first openings in said layer of dielectric, creating said first gate electrodes.

11. The method of claim 1 wherein said creating second gate electrodes comprises the steps of:
second patterning and etching said layer of dielectric, creating second openings in said layer of dielectric, said second openings to align with the surface of said layer of gate base material where a second thickness layer of gate base material is to be created;
second etching said layer of gate base material;
depositing a second layer of gate electrode material over the surface of said layer of dielectric; and
removing said second layer of gate electrode material from the surface of said layer of dielectric, leaving said second gate electrode material inside said second openings in said layer of dielectric.

12. The method of claim 11 whereby said second patterning and etching said layer of dielectric creates second openings in said layer of dielectric, said second openings align with second regions in said layer of gate base material where gate base material layers of a second thickness are to be created, exposing said layer of said gate base material in said regions of second thickness.

13. The method of claim 11 whereby said second etching said layer of gate base material is etching said layer of gate base material in said regions of second thickness to a thickness, creating layers of gate base material of a second thickness.

14. The method of claim 13, said layer of gate base material comprising pad oxide, said second etching said layer of gate base material in said regions of second thickness to a thickness is a rapid thermal oxidation at a temperature between about 800 and 1000 degrees C. for a time between about 10 and 20 seconds, forming a layer of gate oxide with a thickness between about 10 and 30 Angstrom.

15. The method of claim 13, said layer of gate base material comprising pad oxide, said second etching said layer of gate base material in said regions of second thickness to a thickness is a rapid thermal oxidation at a temperature between about 800 and 1000 degrees C. for a time between about 20 and 40 seconds thereby forming a layer of gate oxide with a thickness between about 40 and 70 Angstrom.

16. The method of claim 11 whereby said depositing a second layer of gate electrode material over the surface of said layer of dielectric includes depositing said layer of gate electrode material to a thickness of between about 3000 and 4000 Angstrom over the surface of said layers of gate base material of second thickness.

17. The method of claim 11 whereby said removing said second layer of gate electrode material from the surface of said layer of dielectric is leaving said second gate electrode material inside said second openings in said layer of dielectric, creating said second gate electrodes.

18. A method of creating thin layers of gate base material of different thickness for dual gate devices, comprising the steps of:

providing a semiconductor substrate said substrate having been provided with Shallow Trench Isolation regions in its surface whereby a layer of gate base material has been deposited on the surface of said substrate including the surface of said STI regions whereby furthermore a channel implant and a well implant and a punchthrough implant have been performed into the surface of said substrate;
depositing a layer of dielectric over the surface of said layer of gate base material;
patterning and etching said layer of dielectric whereby said patterning and etching creates first openings in said layer of dielectric that align with first regions in said layer of gate base material where gate base material layers of a first thickness are to be created thereby exposing said layer of said gate base material in said regions of first thickness;
etching said layer of gate base material in said regions of first thickness to the required thickness thereby creating layers of gate base material of a first thickness;
depositing a first layer of gate electrode material over the surface of said layer of dielectric thereby including the surface of said layers of gate base material of first thickness;
removing said first layer of gate electrode material from the surface of said layer of dielectric thereby leaving said first gate electrode material inside said first openings in said layer of dielectric;
patterning and etching said layer of dielectric whereby said patterning and etching creates second openings in said layer of dielectric that align with the regions in said layer of gate base material where gate bate material layers of a second thickness are to be created thereby creating second regions of exposure of said layer of gate base material in said regions of second thickness;
etching said layer of gate base material in said second regions of exposure to the required thickness thereby creating layers of gate base material of a second thickness;
depositing a second layer of gate electrode material over the surface of said layer of dielectric thereby including the surface of said layers of gate base material of a second thickness;
removing said second layer of gate electrode material from the surface of said layer of dielectric thereby leaving said second gate electrode material inside said second openings in said layer of dielectric; and
removing said layer of dielectric from the surface of said layer of gate base material.

19. The method of claim 18 wherein said layer of gate base material is a blanket layer of pad oxide formed to a thickness of between about 150 and 250 Angstrom through a thermal oxidation method at a temperature of about 900 degrees C. for a time period of about 10 to 20 minutes.

20. The method of claim 18 wherein said depositing a layer of dielectric over the surface of said layer of gate base material is depositing a layer of silicon nitride ($Si_3Ni_4$) using LPCVD or PECVD procedures at a pressure between about 300 mTorr and 400 mTorr, at a temperature between about 600 and 800 degrees C., to a thickness between about 2500 and 3500 Angstrom using $NH_3$ and $SiH_4$.

21. The method of claim 18 wherein said depositing a layer of dielectric over the surface of said layer of gate base material is depositing a layer of silicon nitride ($Si_3Ni_4$) using LPCVD or PECVD procedures at a pressure between about 300 mTorr and 400 mTorr, at a temperature between about 600 and 800 degrees C., to a thickness between about 2500 and 3500 Angstrom using a reactant gas mixture such as dichlorosilane ($SiCl_2H_2$) and ammonia ($NH_3$).

22. The method of claim 18 wherein said etching said layer of dielectric is etching nitride by using an anisotropic Reactive Ion Etch using $CHF_3$ or $SF_6$—$O_2$ as an etchant for a time between about 125 and 175 seconds.

23. The method of claim 18 wherein said gate base material contains pad oxide whereby furthermore said etching said layer of gate base material in said regions of first thickness to the required thickness is a rapid thermal oxidation at a temperature between about 800 and 1000 degrees C. for a time between about 10 and 20 seconds thereby forming a thin layer of gate oxide with a thickness between about 10 and 30 Angstrom.

24. The method of claim 18 wherein said gate base material contains pad oxide whereby furthermore said etching said layer of gate base material in said regions of first thickness to the required thickness is a rapid thermal oxidation at a temperature between about 800 and 1000 degrees C. for a time between about 20 and 40 seconds thereby forming a relatively thick layer of gate base material with a thickness between about 40 and 70 Angstrom.

25. The method of claim 18 wherein said depositing a first layer of gate electrode material is growing a layer of gate electrode material at a temperature between 600 and 640 degrees C. using LPCVD to a thickness of between about 3000 and 4000 Angstrom.

26. The method of claim 18 wherein said removing said first layer of gate electrode material from the surface of said layer of dielectric is applying a process of Chemical Mechanical Polishing to said first layer of gate electrode material said removal creating first gate electrodes inside said first openings in said layer of dielectric said first gate electrodes overlying said layers of gate base material of a first thickness.

27. The method of claim 18 wherein said gate base material contains pad oxide whereby furthermore said etching said layer of gate base material in said second regions of exposure to the required thickness is a rapid thermal oxidation at a temperature between about 800 and 1000 degrees C. for a time between about 10 and 20 seconds thereby forming a thin layer of gate oxide with a thickness between about 10 and 30 Angstrom.

28. The method of claim 18 wherein said gate base material contains pad oxide whereby furthermore said etching said layer of gate base material in said second regions of exposure to the required thickness is a rapid thermal oxidation at a temperature between about 800 and 1000 degrees C. for a time between about 20 and 40 seconds thereby forming a relatively thick layer of gate oxide with a thickness between about 40 and 70 Angstrom.

29. The method of claim 18 wherein said depositing a second layer of gate electrode material over the surface of said layer of nitride is growing a layer of gate electrode material at a temperature between 600 and 640 degrees C. using LPCVD to a thickness of between about 3000 and 4000 Angstrom.

30. The method of claim 18 wherein said removing said second layer of gate electrode material from the surface of said layer of nitride is applying a process of Chemical Mechanical Polishing to said second layer of gate electrode material said removal creating second gate electrodes inside said second openings in said layer of dielectric said second gate electrodes overlying said layers of gate base material of a second thickness.

31. The method of claim 18 wherein said dielectric contains nitride whereby furthermore said removing said dielectric from the surface of said layer of gate base material is removing nitride by applying a wet etch using a buffered oxide etchant (BOE) comprising a mixed solution of fluoroammonium and fluorohydrogen (7:1) and phosphoric acid solution.

32. The method of claim 18 wherein said dielectric contains nitride whereby furthermore said removing of said dielectric from the surface of said layer of gate base material is removing nitride applying an anisotropic RIE using $CHF_3$ or $SF_6$—$O_2$ as an etchant.

33. The method of claim 18 wherein said dielectric contains nitride whereby furthermore said removing of said dielectric from the surface of said layer of gate base material is dipping said nitride into phosphoric acid ($H_3PO_4$).

* * * * *